United States Patent
Kim

(10) Patent No.: US 10,660,195 B2
(45) Date of Patent: May 19, 2020

(54) PRINTED CIRCUIT BOARD AND ELECTRONIC COMPONENT PACKAGE INCLUDING SAME

(71) Applicant: LG INNOTEK CO., LTD., Seoul (KR)

(72) Inventor: Yang Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/098,380

(22) PCT Filed: May 2, 2017

(86) PCT No.: PCT/KR2017/004639
§ 371 (c)(1),
(2) Date: Nov. 1, 2018

(87) PCT Pub. No.: WO2017/191968
PCT Pub. Date: Nov. 9, 2017

(65) Prior Publication Data
US 2019/0166682 A1    May 30, 2019

(30) Foreign Application Priority Data
May 2, 2016 (KR) .................. 10-2016-0053962

(51) Int. Cl.
*H05K 1/02* (2006.01)
*H01L 23/538* (2006.01)
(Continued)

(52) U.S. Cl.
CPC ............. *H05K 1/023* (2013.01); *H01L 23/48* (2013.01); *H01L 23/538* (2013.01);
(Continued)

(58) Field of Classification Search
CPC ........ H05K 1/02; H05K 1/023; H05K 1/0215; H05K 1/0216; H05K 1/0218; H05K 1/0228; H05K 1/0233; H05K 1/00; H05K 1/024
(Continued)

(56) References Cited

U.S. PATENT DOCUMENTS 5,165,055 A    11/1992  Metsler
6,111,479 A     8/2000  Myohga et al.
(Continued)

FOREIGN PATENT DOCUMENTS

JP    10-242602 A    9/1998
JP    2001-102517 A  4/2001
(Continued)

OTHER PUBLICATIONS

"Designing for EMC," XP-002784985, Internet Citation, May 3, 1997, URL: http://alt.ife.tugraz.at/Elektronik/Winkler/Files/desfremc.htm (9 pages).
(Continued)

*Primary Examiner* — Paul Dinh
(74) *Attorney, Agent, or Firm* — Birch, Stewart, Kolasch & Birch, LLP

(57) ABSTRACT

An embodiment provides a printed circuit board and an electronic component package including the same, the printed circuit board comprising: a data line layer; a ground layer disposed on the data line layer; a power line layer disposed on the ground layer; and insulation layers disposed between the data line layer and the ground layer and between the ground layer and the power line layer, respectively, wherein the ground layer comprises a common ground and a chassis ground electrically insulated from the common ground.

8 Claims, 7 Drawing Sheets

(51) Int. Cl.
- *H01L 23/48* (2006.01)
- *H05K 1/11* (2006.01)
- *H02J 7/00* (2006.01)
- *H02J 7/14* (2006.01)

(52) U.S. Cl.
CPC .............. *H02J 7/0029* (2013.01); *H02J 7/14* (2013.01); *H05K 1/02* (2013.01); *H05K 1/0215* (2013.01); *H05K 1/0254* (2013.01); *H05K 1/0298* (2013.01); *H05K 1/11* (2013.01); *H02J 7/00304* (2020.01)

(58) Field of Classification Search
USPC ........................................................ 716/137
See application file for complete search history.

(56) References Cited

U.S. PATENT DOCUMENTS

| | | | | |
|---|---|---|---|---|
| 2005/0077622 A1* | 4/2005 | Martwick | ............... | H01L 23/50 257/724 |
| 2005/0151693 A1* | 7/2005 | Schantz | ................... | H01Q 1/38 343/767 |
| 2005/0275368 A1* | 12/2005 | Sippola | ................. | H02M 1/126 318/800 |
| 2007/0040689 A1* | 2/2007 | Reynolds | ................ | G01S 13/74 340/572.7 |
| 2008/0169125 A1* | 7/2008 | Hsu | ...................... | H01R 23/688 174/263 |
| 2011/0317384 A1* | 12/2011 | Makaibara | ........... | H05K 1/0233 361/764 |
| 2013/0300429 A1 | 11/2013 | Jefferies et al. | | |
| 2014/0204546 A1* | 7/2014 | Baker | ................... | H05K 1/024 361/760 |
| 2015/0264801 A1* | 9/2015 | Martin | ................. | H05K 1/0218 361/760 |

FOREIGN PATENT DOCUMENTS

| | | |
|---|---|---|
| JP | 2001-267902 A | 9/2001 |
| JP | 2015-156424 A | 8/2015 |
| KR | 10-2010-0082507 A | 7/2010 |

OTHER PUBLICATIONS

European Search Report dated Dec. 16, 2019 issued in corresponding European Patent Application No. 17792870.2.

* cited by examiner

[FIG. 1]
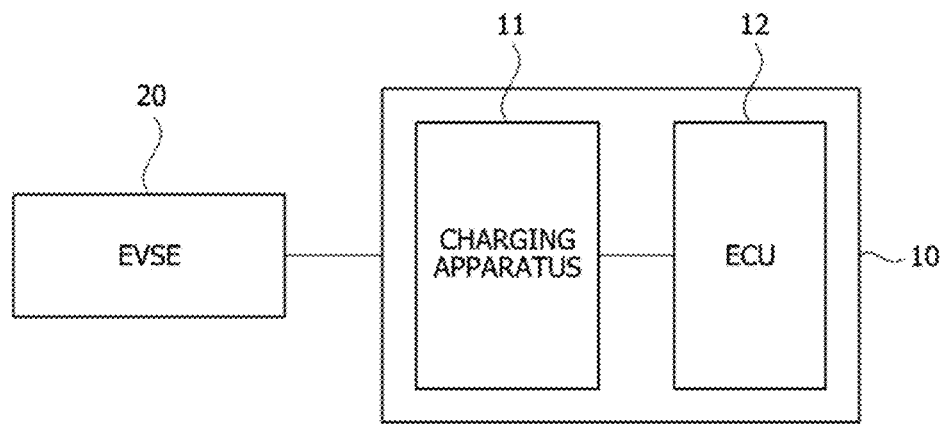
[FIG. 2]
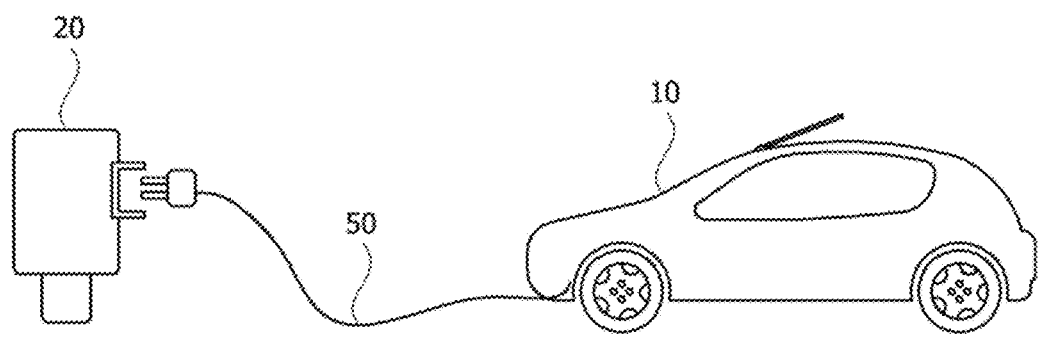

[FIG. 3]
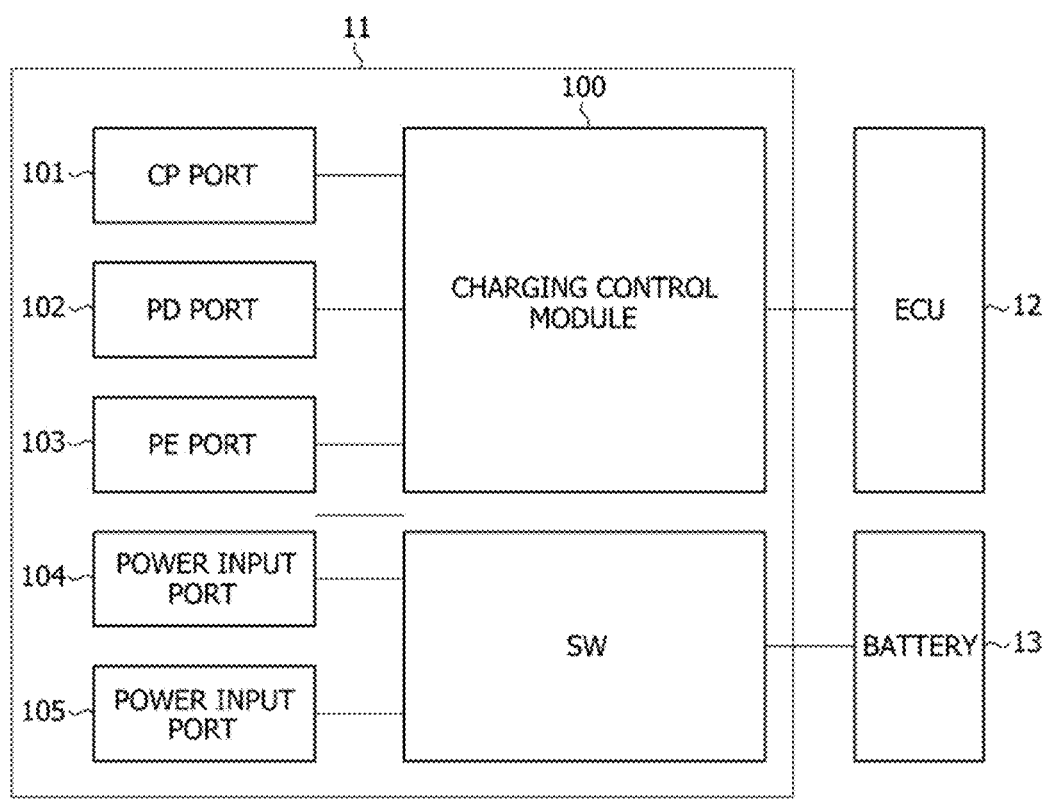

[FIG. 4]
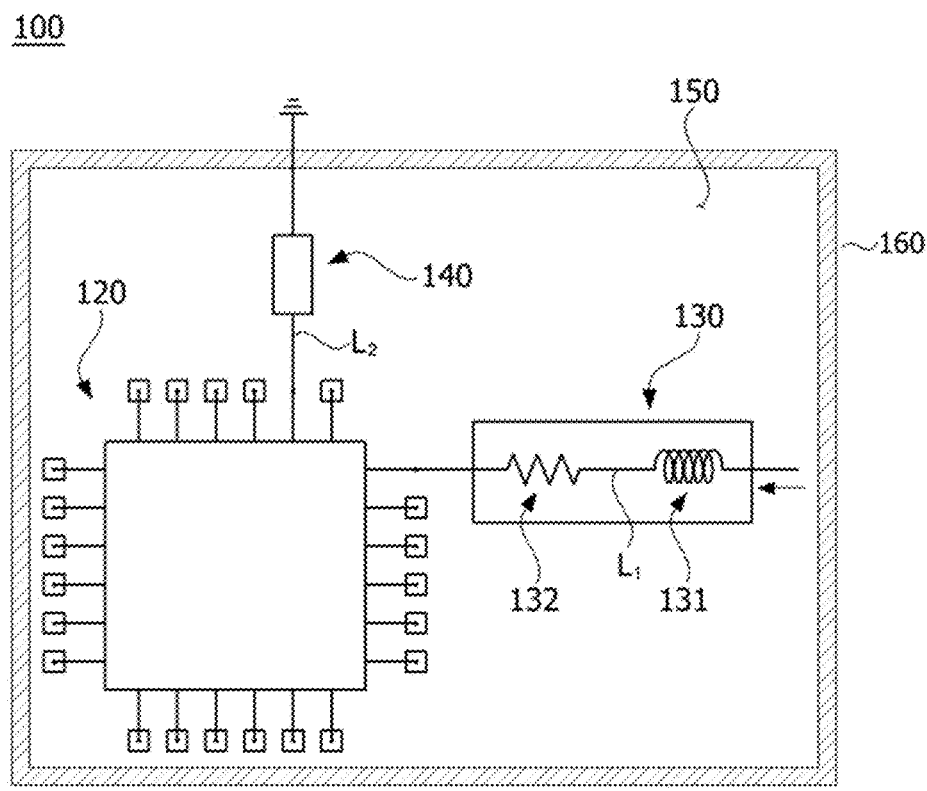
[FIG. 5]
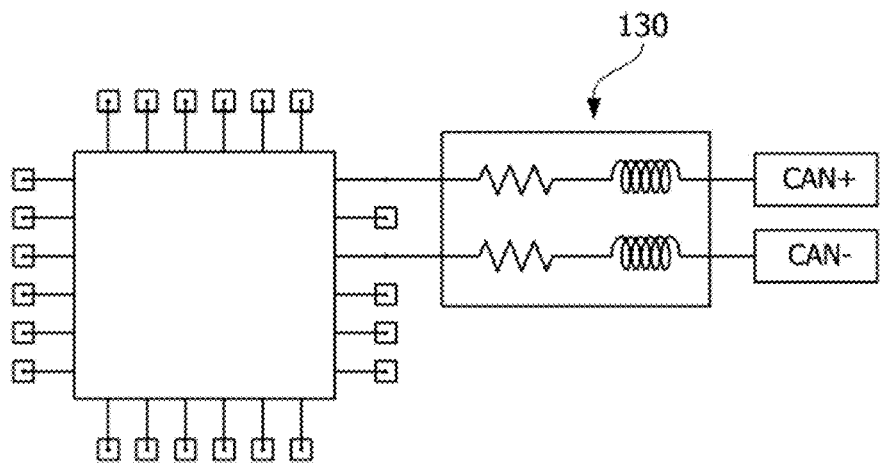

[FIG. 6]
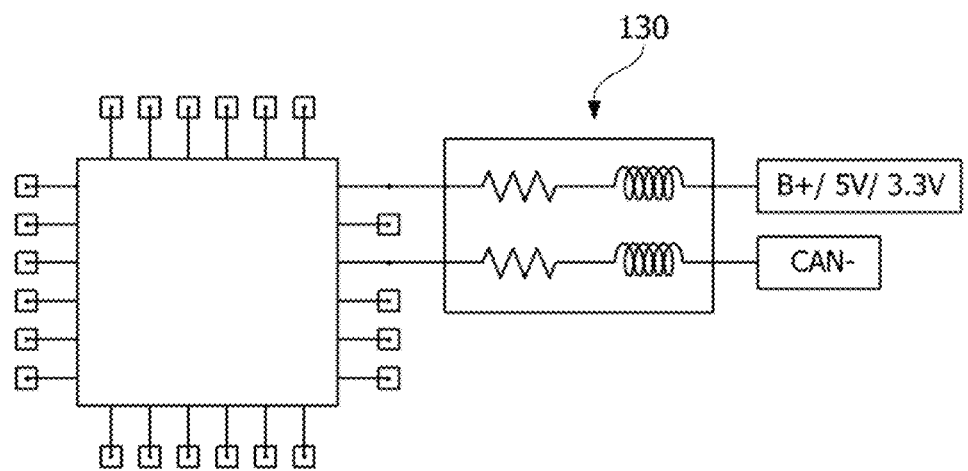
[FIG. 7]
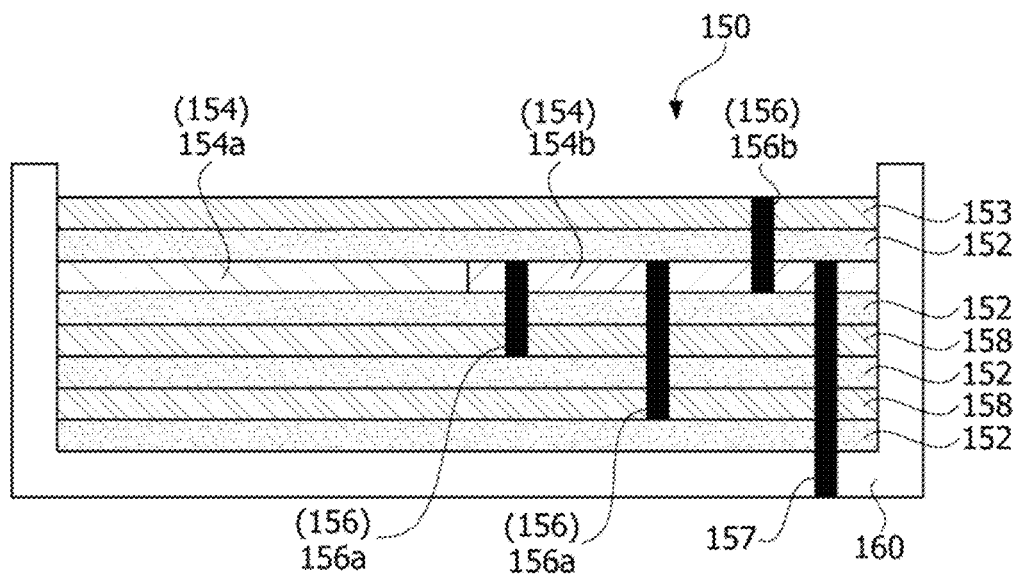

[FIG. 8]
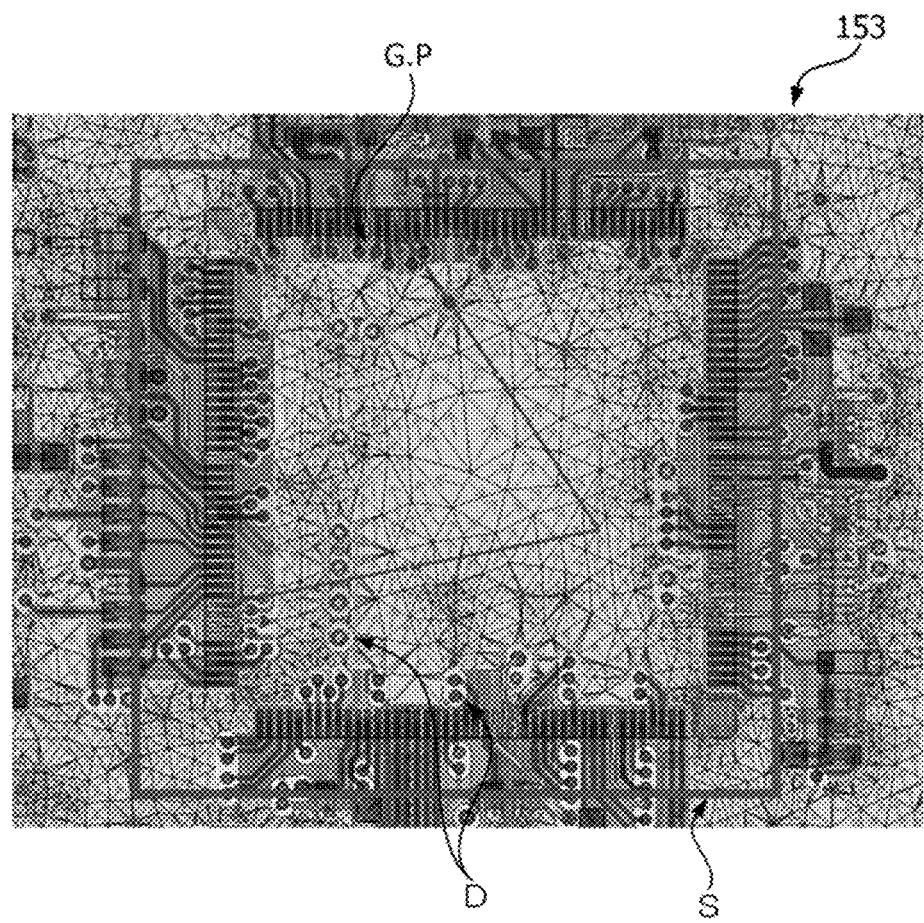

[FIG. 9]
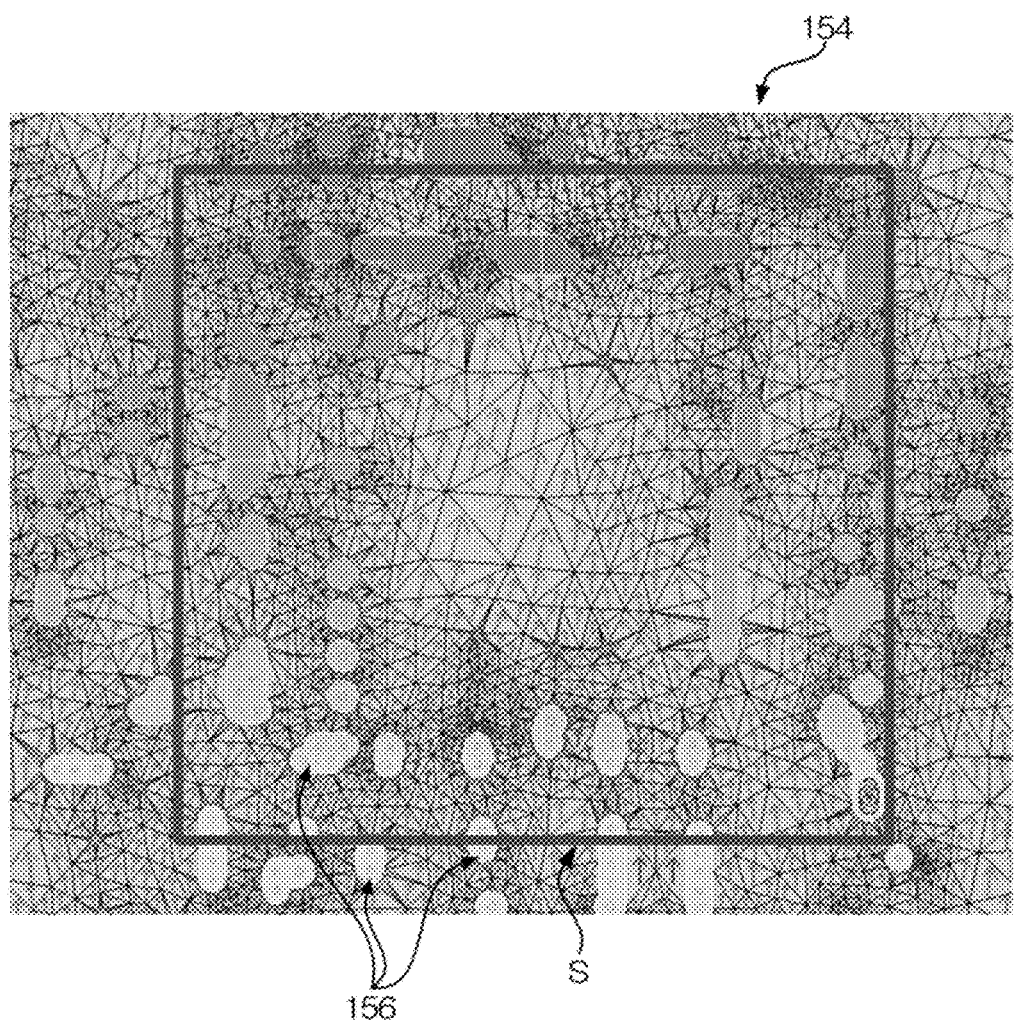

[FIG. 10]
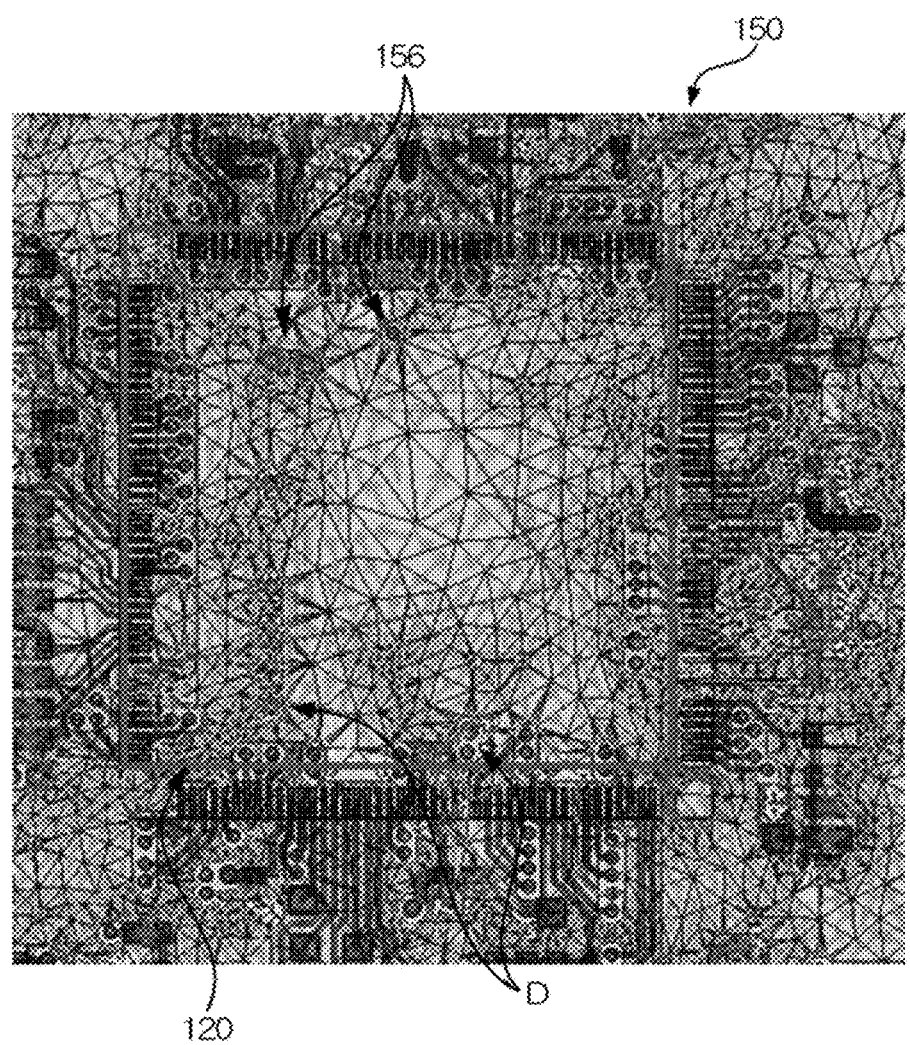

PRINTED CIRCUIT BOARD AND ELECTRONIC COMPONENT PACKAGE INCLUDING SAME

CROSS REFERENCE TO RELATED APPLICATIONS

This application is the National Phase of PCT International Application No. PCT/KR2017/004639, filed on May 2, 2017, which claims priority under 35 U.S.C. 119(a) to Patent Application No. 10-2016-0053962, filed in the Republic of Korea on May 2, 2016, all of which are hereby expressly incorporated by reference into the present application.

TECHNICAL FIELD

The present invention relates to a printed circuit board and an electronic component package including the same.

BACKGROUND ART

Driving devices, such as electric vehicles (EV) or plug-in hybrid electric vehicles (PHEV), use electric vehicle supply equipment (EVSE) installed in charging stations to charge batteries.

When the EV is being charged and only a charge plug is coupled to an inlet of an EV while a portable charger is not connected to a power source, because an electronic control unit (ECU) of the vehicle recognizes that the plug is connected to the inlet and enters a turn-on state, a case in which power is consumed in a state in which the vehicle is not driven and stops, may occur.

In order to solve such a problem, a charging control module (electric vehicle communication controller (EVCC)), which is configured to apply power using a pulse width modulation (PWM) signal of a control pilot output when a power plug of the portable charger is connected to a wall mount so that the charger is ready, is needed.

The EV is usually in an environment in which a high voltage is applied thereto or a high current flows therethrough. Accordingly, there is a risk in that an excessive current or voltage is applied to a plurality of integrated chips (IC) embedded in the charging control module (EVCC) and damages the plurality of IC chips.

DISCLOSURE

Technical Problem

The present invention is directed to providing a printed circuit board including a protection circuit capable of protecting an integrated circuit (IC) even when an excessive current is introduced into the IC, and an electronic component package including the same.

In addition, the present invention is directed to providing a printed circuit board capable of discharging an excessive current applied to an IC to the outside, and an electronic component package including the same.

Technical Solution

One aspect of the present invention provides a printed circuit board comprising: a data line layer; a ground layer disposed above the data line layer; a power line layer disposed above the ground layer; and insulation layers interposed between the data line layer and the ground layer, and between the ground layer and the power line layer, wherein the ground layer includes a common ground and a chassis ground electrically insulated from the common ground.

The printed circuit board may further include: a plurality of through electrodes which pass through the insulation layer and electrically connect the data line layer and the chassis ground and a chassis electrode which electrically connects the chassis ground to a chassis case.

The plurality of through electrodes may be disposed in a current concentration region, and the current concentration region may be a region of which a current density is 1.2 or more times an average current density of the printed circuit board.

The plurality of through electrodes may be disposed in a region in which a current density is in a range of 0.1 A/mm$^2$ to 20 A/mm$^2$.

A minimum separation distance between the chassis electrode and the plurality of through electrodes may be in a range of 0.1 to 0.25 times a diameter of the chassis electrode.

The printed circuit board may further include a protection circuit including an inductor and a resistor which are connected in series.

The inductor may be disposed in front of the resistor in a data transmission direction.

One aspect of the present invention provides an electronic component package includes: a chassis case; a printed circuit board disposed inside the chassis case; and at least one active component disposed on the printed circuit board and including a plurality of grounds, wherein the printed circuit board includes a data line layer, a ground layer disposed above the data line layer and including a common ground and a chassis ground electrically insulated from the common ground, a power line layer disposed above the ground layer, insulation layers interposed between the data line layer and the ground layer and between the ground layer and the power line layer, a plurality of through electrodes which pass through the insulation layer and electrically connect grounds of active components to the chassis ground, a chassis electrode which electrically connects the chassis ground to the chassis case, and a protection circuit connected to the active component, wherein the protection circuit includes an inductor and a resistor which are connected in series, the inductor is disposed in front of the resistor in a direction in which data is transmitted to the active component, the plurality of through electrodes connect a ground disposed in a current concentration region among the grounds of the active component to the chassis electrode, and a current density of the current concentration region is 1.2 or more times an average current density of the printed circuit board.

Advantageous Effects

According to embodiments, malfunction and stop phenomena of a product due to an excessive current can be reduced when using a protection circuit.

In addition, an excessive current can be rapidly discharged through a ground to protect components. Accordingly, the influence of a high voltage and/or an excessive current can be minimized in an electric vehicle (EV) in which a high voltage of 1100 V is applied and a high current of 200 A or more flows.

DESCRIPTION OF DRAWINGS

FIG. 1 is a block diagram illustrating a charging system of an electric vehicle (EV) according to one embodiment of the present invention.

FIG. 2 is a view illustrating an example of a method of connecting an EV to an electric vehicle supply equipment (EVSE).

FIG. 3 is a block diagram illustrating a charging apparatus of the EV according to one embodiment of the present invention electric vehicle.

FIG. 4 is a conceptual view illustrating a charging control module according to one embodiment of the present invention.

FIG. 5 is a view showing a state in which a protection circuit is connected to data lines of an integrated circuit (IC).

FIG. 6 is a view showing a state in which the protection circuit is connected to the power lines of the IC.

FIG. 7 is a conceptual view illustrating a printed circuit board according to one embodiment of the present invention.

FIG. 8 is a view showing a flow of current in a surface layer.

FIG. 9 is a view showing a flow of current in a ground layer.

FIG. 10 is a view showing a flow of current in the IC.

MODES OF THE INVENTION

As the invention allows for various changes and numerous embodiments, specific embodiments will be illustrated in the drawings and described in detail in the written description. However, this is not intended to limit the present invention to specific modes of practice, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited to these terms. These terms are only used to distinguish one element from another. For example, a first element could be termed a second element, and a second element could similarly be termed a first element without departing from the scope of the present invention. As used herein, the term "and/or" includes combinations or any one of a plurality of associated listed items.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements.

The terminology used herein is for the purpose of describing particular embodiments only and is not intended to be limiting to the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined here.

Example embodiments of the invention will be described below in more detail with reference to the accompanying drawings. Components that are the same or correspond to each other are rendered the same reference numeral regardless of the figure number, and redundant description will be omitted.

FIG. 1 is a block diagram illustrating a charging system of an electric vehicle (EV) according to one embodiment of the present invention, FIG. 2 is a view illustrating an example of a method of connecting an EV to an electric vehicle supply equipment (EVSE), and FIG. 3 is a block diagram illustrating a charging apparatus of the EV according to one embodiment of the present invention electric vehicle.

Referring to FIG. 1, an EV 10 may be charged by EVSE 20. To this end, a charging cable connected to the EVSE 20 may be connected to an injection port of the EV 10. Here, the EVSE 20 is equipment configured to supply an alternating current (AC) or direct current (DC), may be formed to be disposed in a charging station, be disposed in a home, or also be portable.

Referring to FIG. 2, the EV 10 and the EVSE 20 are connected by a charging cable 50, and a plug of the charging cable 50 may be permanently installed in the EV 10. Here, the charging cable 50 may be connected to a socket-outlet for a home or the industry or connected to the charging station.

Referring to FIG. 3, the charging apparatus 11 is included in the EV and connected to an electronic control unit (ECU) 12 in the EV. The charging apparatus 11 of the EV includes a control pilot (CP) port 101, a proximity detection (PD) port 102, a protective earth (PE) port 103, a charging control module 100, and power input ports 104 and 105.

Here, the CP port 101 is a port configured to receive a CP signal transmitted through the charging cable connected to the EVSE.

The PD port 102 is a port configured to detect whether a connector of the charging cable is close to the EVSE 20.

The PE port 103 is a port connected to the ground of the EVSE 20.

The charging apparatus 11 controls a battery 13 to be charged. To this end, the charging apparatus 11 may have a pilot function (PF) logic configured to perform a PF received through the CP port 101 and a PD logic configured to detect whether the connector is inserted into the EVSE 20 by using a signal received through the PD port 102.

When the charging control module 100 receives a signal received through the CP port 101 and a signal received through the PD port 102, the charging control module 100 controls a switch connected to the power input ports 104 and 105 such that the battery 13 receives charging power from the EVSE 20. The charging control module 100 may be an electric vehicle communication controller (EVCC).

However, a configuration of the charging control module is not necessarily limited thereto, and the charging control module may include various components capable of controlling the EV to be charged using the EVCC.

FIG. 4 is a conceptual view illustrating a charging control module according to one embodiment of the present invention, FIG. 5 is a view showing a state in which a protection circuit is connected to data lines of an integrated circuit (IC), and FIG. 6 is a view showing a state in which the protection circuit is connected to the power lines of the IC.

Referring to FIG. 4, the charging control module may include a chassis case 160, a printed circuit board (PCB)

150, and a plurality of active components 120 mounted on the PCB 150. The chassis case 160 may be formed of a metal material forming an exterior.

The active components 120 may include an IC, a field-programmable gate array (FPGA), and the like. For example, the active component 120 may be a micro controller unit (MCU) IC, but is not necessarily limited thereto, and the active components 120 may include active components 120 configured to perform various functions.

In the present embodiment, the EVCC configured to control the EV to be charged is described as one embodiment, but is not necessarily limited thereto, and the present invention may be applied to various types of electronic component packages in which active components are disposed on PCBs. That is, the present invention may be applied to various electronic components such as camera modules and navigation systems.

The active components 120 may include a plurality of ports mounted on the PCB 150, and the plurality of ports may include a power port, a data port, and a ground port. The data port may be electrically connected to a data line L1 formed on the PCB 150.

According to the embodiment, a protection circuit 130 including an inductor 131 and a resistor 132 which are connected in series may be connected to the data line L1. In a case in which an excessive current is applied to the data line, the protection circuit 130 may protect the active components 120.

The protection circuit 130 may include the inductor 131 and the resistor 132 which are connected in series. For example, the resistor 132 may serve to perform impedance matching of a transmission line, and the inductor 131 may serve to compensate for overshoot or undershoot due to an excessive current.

Here, the inductor 131 may be disposed relatively close to an input terminal, and the resistor 132 may be disposed close to the active components 120. Because the inductor 131 has a capacity greater than that of the resistor 132, disposing the inductor 131 to be close to the input terminals advantageous for preventing data loss. In addition, when the inductor 131 is disposed close to the input terminal, the excessive current due to a peak current is compensated and a signal with a clean waveform can be transmitted or received.

The inductor 131 and the resistor 132 of the protection circuit 130 may perform impedance matching of the transmission line with about 25 ohm to 75 ohm. Accordingly, noise of a data signal and a signal distortion phenomenon can be reduced.

The protection circuit 130 may be designed to have a suitable value by considering an inductive reactance and a capacitive reactance. Here, the protection circuit 130 may be designed by considering a frequency of an introduced current, the number of data clocks, and the like.

Due to the protection circuit 130 according to the embodiment, overshoot and undershoot, which occur due to an input current, can be reduced. Accordingly, the influence of a current can be minimized to reduce malfunction and stop phenomena. Accordingly, a configuration of the protection circuit 130 according to the embodiment may be distinguished from a pass filter configured to cut off frequencies outside of a specific bandwidth.

However, the protection circuit 130 is not necessarily limited thereto and is not particularly limited as long as the protection circuit 130 may perform the impedance matching of the transmission line and compensate a distorted signal. The distorted signal may also be compensated using an RLC or RC circuit other than the above-described RL circuit.

Referring to FIG. 5, when an excessive current is introduced into the data line and a data signal is distorted, a phenomenon in which communication and image transmission are not performed occurs. Here, the resistor 132 may serve as an impedance matching circuit between a controller area network (CAN) IC and an IC chip. The inductor 131 may serve to compensate an excessive current due to a peak current flowing between the CAN IC and the IC chip. A value of current may be compensated according to the same principle even in a case in which an excessive current is applied to the power line as illustrated in FIG. 6.

Referring again to FIG. 4, a ground structure 140 of the PCB 150 is connected to the chassis case 160 to discharge an excessive current applied to the IC chip to a chassis ground. According to the embodiment, the PCB 150 compensates a peak current using the protection circuit 130, and an excessive current which is out of a range of design of the protection circuit 130 may be rapidly discharged through the chassis ground. Accordingly, the active components 120 can be protected even when various types of excessive voltages or currents are applied through the transmission line.

FIG. 7 is a conceptual view illustrating the PCB according to one embodiment of the present invention, FIG. 8 is a view showing a flow of current in a surface layer, FIG. 9 is a view showing a flow of current in a ground layer, and FIG. 10 is a view showing a flow of current in the IC.

Referring to FIG. 7, the PCB 150 includes a first layer 158 on which the data line configured to transmit a data signal to the active components 120 is formed, a second layer 153 on which the power line configured to apply power to the active components 120 is formed, a ground layer 154 including a common ground 154a and a chassis ground 154b which are electrically insulated from each other, a plurality of insulation layers 152 interposed between the first layer 158, the second layer 153, and the ground layer 154, a plurality of through electrodes 156 which electrically connect the first layer 158 to the chassis ground 154b, and a chassis electrode 157 which electrically connects the chassis ground 154b to the chassis case 160.

A circuit board may include a resin-based PCB 150, a metal core PCB, a flexible PCB, a ceramic PCB, and a flame retardant (FR)-4 board.

Since the first layer 158 generates noise of high frequency waves, the first layer 158 may be disposed under the ground layer 154 in order to minimize radiation of the high frequency waves. Accordingly, the ground layer 154 may serve as a shield configured to block noise radiated by the first layer 158. Since the second layer 153 generates noise of low frequency waves, the second layer 153 may be disposed above the ground layer 154. The ground layer 154 may be interposed between the first layer 158 and the second layer 153.

However, the arrangement of the layers is not necessarily limited thereto and may also be variously changed. The first layer 158 may include a plurality of layers according to design of a circuit pattern. A surface layer on which IC chips are mounted may also further be disposed on the second layer 153.

The ground layer 154 includes a chassis ground 154b electrically connected to the chassis case 160 and a common ground 154a insulated from the chassis ground 154b. The chassis ground 154b may be electrically connected to a body of the EV to secure a stable ground area. The common ground 154a may be a ground region except for the chassis ground 154b. The common ground 154a is a general PCB ground and may be connected to the ground of the active components.

The through electrodes 156 may pass through the insulation layer 152 and electrically connect the first layer 158 and/or the second layer 153 to the chassis ground 154b. The through electrodes 156 include a plurality of first through electrodes 156a which connect the first layer 158 to the chassis ground 154b and a plurality of second through electrodes 156b which connect the second layer 153 to the chassis ground 154b. Although not illustrated in the drawing, the common ground 154a may also be connected to the ground of IC through the through electrode.

The first through electrodes 156a and the second through electrodes 156b may be formed in current concentration regions in which a current density is high. According to such a configuration, a region in which a current density becomes high in the circuit board may be grounded with the chassis case 160 so that a current can be rapidly discharged. In addition, since the chassis case 160 is connected to the body of the EV, the chassis case 160 may secure a wide ground area.

Since the IC generally includes a plurality of ground ports, it may be difficult to connect all the grounds to the chassis ground when a circuit is designed. Accordingly, in the embodiment, ground regions at which a current is collected when an excessive current is applied are selected and connected to the chassis ground 154b, and the remaining ground regions are connected to the common ground 154a to prevent damage of the IV chip when the excessive current is applied.

The structure in which the chassis ground 154b and the common ground 154a are electrically insulated from each other has various advantages. For example, the structure may block an external noise signal applied from another IC. External noise due to coupling may be introduced into a power line or signal line through a harness. In this case, when all the grounds are designed to be connected to one ground, there may be a problem in that noise transmitted to the power line is introduced into the signal line through the ground. For example, since a power IC is operated at a low frequency of several KHz, the power IC may not be affected by external noise between 1 to 400 MHz. However, since a communication IC is operated at a frequency of several tens MHz, the communication IC may be greatly affected. Accordingly, there is an advantage in that the power IC and the communication IC are connected to different grounds so that noise of the power IC is prevented from being introduced into the communication IC. For example, the communication IC may also be connected to the chassis ground, and the power IC may also be connected to the chassis ground.

According to the embodiment, since the common ground and the chassis ground are electrically separated, external noise can be bypassed and an interference due to the external noise introduced through the power line can be minimized. Accordingly, the IC which is weak against noise can be protected.

The chassis ground 154b may be connected to the plurality of through electrodes 156 and the chassis electrode 157. A diameter of the chassis electrode 157 may be in the range of 2 cm to 5 cm. The chassis electrode 157 and the through electrode 156 may be disposed to be spaced apart from each other by at least 3 to 5 mm. In a case in which the chassis electrode 157 and the through electrode 156 are disposed to be spaced apart from each other by less than 3 mm, an excessive current may not be discharged to the outside through the chassis electrode 157 but may return to the board through the through electrode 156. A minimum separation distance between the chassis electrode 157 and the plurality of through electrodes 156 may be in the range of 0.1 to 0.25 times the diameter of the chassis electrode 157.

Referring to FIGS. 8 and 9, in a case in which an excessive current is applied from the outside through the data line and/or the power line, current flows in all the layers. The current also flows in the outermost layer as illustrated in FIG. 8, and in the ground layer 154 as illustrated in FIG. 9. Here, a region in which the current is concentrated is generated in each of the layers. The large number of current concentration regions D may be distributed in a region S in which the active components are disposed.

The current concentration region D may be defined as a region of which a current density is in the range of 1.2 to 1.5 times an average current density of the PCB 150. The current concentration region may also be a ground region, or may not be a ground region but may be a region in which a current is concentrated when the circuit is designed. An excessive current may be applied to the data line of the circuit board, and a current direction and a current density may be measured to calculate the current concentration region D. For example, a current density of the current concentration region D may be in the range of $1E+05$ $A/m^2$ to $2E+07$ $A/m^2$ (about 100,000 $A/m^2$ to 20,000,000 $A/m^2$, or 0.1 $A/mm^2$ to 20 $A/mm^2$). The current density may be defined as a value of current per area.

According to the embodiment, as illustrated in FIG. 9, the through electrode 156 is formed on the ground disposed in the current concentration region D and electrically connected to the chassis ground. When an excessive current is applied to the circuit board, a larger current may be concentrated in the current concentration region D. Accordingly, when the current concentration region D is connected to the chassis ground, the excessive current may be rapidly discharged to the outside. After a current concentration region is determined through a simulation or a sample experiment, the through electrode 156 may be connected to the current concentration region.

Referring to FIG. 10, the current concentration region D may be measured in a state in which the active components 120 are mounted on the board. Accordingly, the current concentration region D may be changed according to kinds, disposed positions, and the disposed numbers of the active components or a kind of the circuit board. According to the embodiment, after the active components are mounted on the circuit board, the current concentration region D may be calculated using an excessive current test, and the through electrode 156 may be formed in the corresponding current concentration region D and mechanically connected to the chassis ground. The mechanical connection may be performed by connecting the circuit board to the chassis case 160 by bolt coupling, but is not necessarily limited thereto.

The invention claimed is:

1. A printed circuit board comprising:
   a data line layer on which a data line is disposed;
   a ground layer disposed above the data line layer, the ground layer including a common ground and a chassis ground electrically insulated from the common ground;
   a power line layer disposed above the ground layer and on which a power line is disposed;
   insulation layers interposed between the data line layer and the ground layer and between the ground layer and the power line layer;
   a first through electrode passing through the insulation layer and electrically connecting the data line layer to the chassis ground;

a second through electrode passing through the insulation layer and electrically connecting the power line layer to the chassis ground; and a chassis electrode which electrically connects the chassis ground to a chassis case, wherein a minimum separation distance between the chassis electrode and the first through electrode and the second through electrode is in a range of 0.1 to 0.25 times a diameter of the chassis electrode.

2. The printed circuit board of claim 1, wherein:

the first through electrode and the second through electrode are disposed in a current concentration region; and the current concentration region is a region of which a current density is 1.2 or more times an average current density of the printed circuit board.

3. The printed circuit board of claim 1, wherein the first through electrode and the second through electrode are disposed in a region of which a current density is in a range of 0.1 A/mm$^2$ to 20 A/mm$^2$.

4. The printed circuit board of claim 1, further comprising a protection circuit including an inductor and a resistor which are connected in series.

5. The printed circuit board of claim 4, wherein the inductor is disposed in front of the resistor in a data transmission direction.

6. An electronic component package comprising:

a chassis case;

a printed circuit board disposed inside the chassis case;

at least one active component disposed on the printed circuit board and including a plurality of grounds, wherein the printed circuit board includes:

a data line layer on which a data line is disposed;

a ground layer disposed above the data line layer and including a common ground and a chassis ground electrically insulated from the common ground;

a power line layer disposed above the ground layer and on which a power line is disposed, insulation layers interposed between the data line layer and the ground layer and between the ground layer and the power line layer;

a first through electrode passing through the insulation layer and electrically connecting the data line layer to the chassis ground;

a second through electrode passing through the insulation layer and electrically connecting the power line layer to the chassis ground;

a third through electrode passing through the insulation layer and electrically connecting a ground of the at least one active component and the chassis ground;

a chassis electrode which electrically connects the chassis ground to the chassis case, a protection circuit connected to the at least one active component, wherein the protection circuit includes an inductor and a resistor which are connected in series, wherein the inductor is disposed in front of the resistor in a direction in which data is transmitted to the active component, wherein the first through electrode and the second through electrode connect a ground disposed in a current concentration region to the chassis electrode, and wherein a current density of the current concentration region is 1.2 or more times an average current density of the printed circuit board.

7. A printed circuit board comprising:

a data line layer on which a data line is disposed;

a ground layer disposed above the data line layer, the ground layer including a common ground and a chassis ground electrically insulated from the common ground;

a power line layer disposed above the ground layer and on which a power line is disposed;

insulation layers interposed between the data line layer and the ground layer and between the ground layer and the power line layer;

a first through electrode passing through the insulation layer and electrically connecting the data line layer to the chassis ground;

a second through electrode passing through the insulation layer and electrically connecting the power line layer to the chassis ground; and a chassis electrode which electrically connects the chassis ground to a chassis case, wherein the first through electrode and the second through electrode are disposed in a current concentration region, and wherein the current concentration region is a region of which a current density is 1.2 or more times an average current density of the printed circuit board.

8. The printed circuit board of claim 7, wherein a minimum separation distance between the chassis electrode and the first through electrode and the second through electrode is in a range of 0.1 to 0.25 times a diameter of the chassis electrode.

\* \* \* \* \*